United States Patent
Tsuchida et al.

(10) Patent No.: US 6,862,210 B2
(45) Date of Patent: Mar. 1, 2005

(54) MAGNETIC RANDOM ACCESS MEMORY FOR STORING INFORMATION UTILIZING MAGNETO-RESISTIVE EFFECTS

(75) Inventors: Kenji Tsuchida, Kawasaki (JP); Yoshihisa Iwata, Yokohama (JP); Tomoki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/422,971

(22) Filed: Apr. 25, 2003

(65) Prior Publication Data

US 2004/0125647 A1 Jul. 1, 2004

(30) Foreign Application Priority Data

Dec. 27, 2002 (JP) ........................................ 2002-382392

(51) Int. Cl.⁷ ............................................. G11C 11/00
(52) U.S. Cl. ............. 365/158; 365/189.01; 365/230.03; 365/230.06
(58) Field of Search ................................. 365/158, 171, 365/173, 189.01, 230.03, 230.06

(56) References Cited

U.S. PATENT DOCUMENTS

| | | | |
|---|---|---|---|
| 5,894,447 A | 4/1999 | Takashima | |
| 6,169,688 B1 | 1/2001 | Noguchi | |
| 6,331,943 B1 * | 12/2001 | Naji et al. .................. | 365/158 |
| 6,356,477 B1 | 3/2002 | Tran | |
| 6,532,163 B2 * | 3/2003 | Okazawa ..................... | 365/97 |
| 6,724,653 B1 * | 4/2004 | Iwata et al. ................. | 365/158 |
| 2001/0048608 A1 | 12/2001 | Numata et al. | |
| 2002/0034117 A1 | 3/2002 | Okazawa | |
| 2002/0036917 A1 | 3/2002 | Nishimura et al. | |
| 2002/0084500 A1 | 7/2002 | Kang et al. | |
| 2003/0058686 A1 | 3/2003 | Ooishi et al. | |
| 2003/0123271 A1 * | 7/2003 | Iwata ........................... | 365/63 |
| 2003/0156450 A1 * | 8/2003 | Higashi ....................... | 365/173 |

FOREIGN PATENT DOCUMENTS

| | | |
|---|---|---|
| DE | 101 33 646 | 4/2002 |
| GB | 1 076 569 | 7/1967 |
| JP | 2000-132961 | 5/2000 |
| JP | 2001-357666 | 12/2001 |
| JP | 2001-390518 | 12/2001 |
| JP | 2002-8366 | 1/2002 |
| JP | 2002-170379 | 6/2002 |

OTHER PUBLICATIONS

Roy Scheuerlein, et al., "A 10ns Read and Write Non–Volatile Memory Array Using a Magnetic Tunnel Junction and FET Switch in each Cell", IEEE International Solid–State Circuits Conference, ISSC, 2000, 8 pages.

* cited by examiner

*Primary Examiner*—Van Thu Nguyen
(74) *Attorney, Agent, or Firm*—Oblon, Spivak, McClelland, Maier & Neustadt, P.C.

(57) ABSTRACT

A memory cell comprises a magneto-resistive element of which electrical resistance value varies with magnetism. A sub-bit line is connected to one end of the memory cell. A main-bit line is connected to the sub-bit line via a first selection circuit. A sense-amplifier is connected to the main-bit line via a second selection circuit. A wiring line is connected to the other end of the memory cell and arranged in a first direction. A first operation circuit is connected to one end of the wiring line via a third selection circuit. A second operation circuit is connected to the other end of the wiring line. A word line passes over an intersection between the memory cell and the wiring line and is arranged in a second direction perpendicular to the first direction.

18 Claims, 13 Drawing Sheets

MAGNETIC RANDOM ACCESS MEMORY FOR STORING INFORMATION UTILIZING MAGNETO-RESISTIVE EFFECTS

CROSS-REFERENCE TO RELATED APPLICATIONS

This application is based upon and claims the benefit of priority from the prior Japanese Patent Application No. 2002-382392, filed Dec. 27, 2002, the entire contents of which are incorporated herein by reference.

BACKGROUND OF THE INVENTION

1. Field of the Invention

The invention relates to a magnetic random access memory for storing information of "1" or "0" by utilizing the magneto-resistive effects.

2. Description of the Related Art

A Magnetic Random Access Memory (MRAM) is a storage device for storing information of "1" or "0" by utilizing the magneto-resistive effects. Recently, many companies have started developments of the MRAM as one of candidates of universal storage devices combining non-volatility, a high integration density, high reliability, low power-dissipation, and high-speed operations.

As the magneto-resistive effects, there are two known effects of the Giant Magneto-Resistive (GMR) effect and the Tunnel Magneto-Resistive (TMR) effect. An element which exhibits the GMR effect utilizes an effect that the resistance of a conductor sandwiched between two ferromagnetic layers varies in accordance with spin alignment of these upper and lower ferromagnetic layers. The MR ratio, which indicates a ratio of the variation in magnetic resistance value, however, is as low as about 10%, so that a read-out signal for stored information is small. Therefore, the most critical problem in implementation of an MRAM has been to preserve a read-out margin, thus persuading the industries of insufficient practicability of the MRAM.

One example of an element which exhibits the TMR effect, on the other hand, is a Magnetic Tunnel Junction (MTJ) element which has a stack structure composed of two ferromagnetic layers and an insulation film sandwiched between these two metal ferromagnetic layers and utilizes a variation in magnetic resistance owing to the spin polarization tunnel effect. The MTJ element exhibits the maximum tunneling probability between the two magnetic layers via the tunnel insulation film therebetween when the upper and lower ferromagnetic layers are parallel to each other in spin alignment, thus resulting in the minimum resistance of the tunnel insulation film. When they are anti-parallel to each other in spin alignment, on the other hand, that tunnel probability is minimized, thus maximizing the resistance of the tunnel insulation film.

To implement these two spin states, either one of the above-mentioned two magnetic films is fixed in magnetization direction, to avoid an influence of external magnetization. This layer is generally referred to as a PIN layer. The other magnetic film can be programmed so that its magnetization direction may be parallel or anti-parallel to that of the PIN layer in accordance with the direction of a magnetic field applied thereon. This layer is generally referred to as a FREE layer, having a role of storing information. There is presently obtained a certain type of MTJ element that exhibits an MR ratio as the resistance variation ratio in excess of 50%, which type is becoming a main target of the developments of MRAMs.

Data can be written into an MRAM using an MTJ element by inverting the magnetization direction of the above-mentioned FREE layer by flowing at least a constant current through a bit line and a word line which are orthogonal to each other over each memory cell to thereby control that magnetization direction of the FREE layer with the magnitude of a resultantly occurring synthetic magnetic field.

On the other hand, data can be read out from it by applying a voltage between the two magnetic films of an MTJ element that corresponds to a selected bit to thereby read out the value of resistance from a resultantly flowing current or by flowing a constant current through the selected MTJ element to thereby read out a resultantly occurring voltage between these two magnetic films.

One example of the MRAMs using such an MTJ element uses two MOS transistors and two MTJ elements to represent one-bit data and is reported in a literature of, for example, "A 10-ns Read and Write Non-Volatile Memory Array Using a Magnetic Tunnel Junction and FET Switch in each Cell" in a digest of Technical Paper, p. 128, of ISSC C2000. The MRAM reported in this literature, however, constitutes one-bit data of two MOS transistors and two MTJ elements as described above and so finds it difficult to provide a mass-capacity memory.

On the contrary, such a method is proposed (see, for example, Jpn. Pat. Appln. No. 2001-390518) as to manufacture another example of MRAM using an MTJ element in which, as shown in FIG. 1, a selection MOS transistor SG1 is shared in use by a plurality of memory cells MC1 through MC4 to enable reducing the cell area, thus contributing to an increase in integration density.

The MRAM according to this proposed method has such a cell cross section as shown in FIG. 2, for example. On a semiconductor substrate 101 are there arranged a gate wiring line RSW1 of the selection MOS transistor SG1 and a select line SL1 which is connected to a diffusion layer 102 of the selection MOS transistor SG1. Furthermore, above the select line SL1 are there arranged a write-in bit line WBL1 and a sub-bit line SBL1. On the sub-bit line SBL1 are there arranged MTJ elements MTJ1 through MTJ4 which constitute memory cells MC1 though MC4 respectively.

The MRAM having a structure shown in FIG. 2 has such a wiring configuration that the write-in bit line WBL1 is physically separated from the MTJ elements. The write-in bit line WBL1 has a role of generating two magnetic fields having different directions in order to determine the alignment of a FREE layer of the MTJ element, so that the physical separation of the write-in bit line WBL1 and the MTJ elements may give rise to a suspected a decrease in intensity of an easy-axis directional write-in magnetic field applied on the MTJ elements, which is a key to information storage. Therefore, to solve it, a bit line current must be increased, thus leading to a problem of an increase in current dissipation.

BRIEF SUMMARY OF THE INVENTION

A magnetic random access memory according to an aspect of the present invention comprises: a memory cell including a magneto-resistive element of which electrical resistance is altered by magnetism; a sub-bit line which is connected to one end of the memory cell; a main-bit line which is connected to the sub-bit line via a first selection circuit; a sense-amplifier which is connected to the main-bit line via a second selection circuit; a wiring line which is connected to the other end of the memory cell and disposed in a first direction; a first operation circuit which is connected to one end of the wiring line via a third selection circuit; a second operation circuit which is connected to the other end of the wiring line; and a word line which passes through an interconnection point between the memory cell and the wiring line and is disposed orthogonal to the first direction, wherein:

during a read-out operation of reading out data from the memory cell, the first operation circuit acts as a word line driver so that the wiring line may provide a read-out word line; and during a write-in operation of writing data into the memory cell, the first operation circuit acts as either one of a bit line driver and a bit line sinker and the second operation circuit acts as the other of the either one of the bit line driver and the bit line sinker so that the wiring line may provide a write-in bit line.

DETAILED DESCRIPTION OF THE INVENTION

Before describing embodiments of the invention, the following will explain a magnetic random access memory (MRAM) as a reference example.

Figure 1:
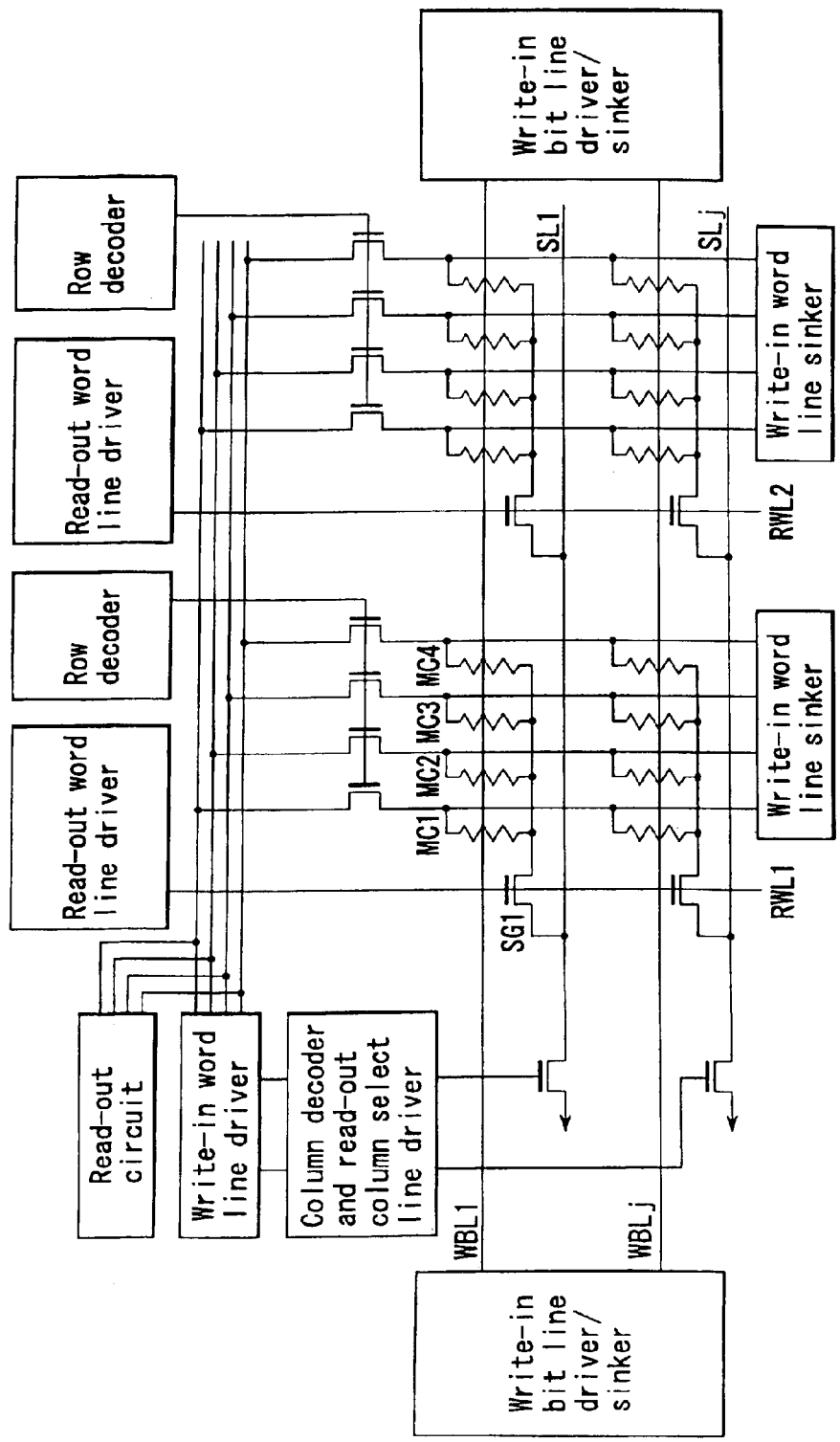
FIG. 1 is an equivalent circuit diagram of a magnetic random access memory which incorporates a conventional cross-point type memory cell and a selection MOS transistor.
Figure 3:
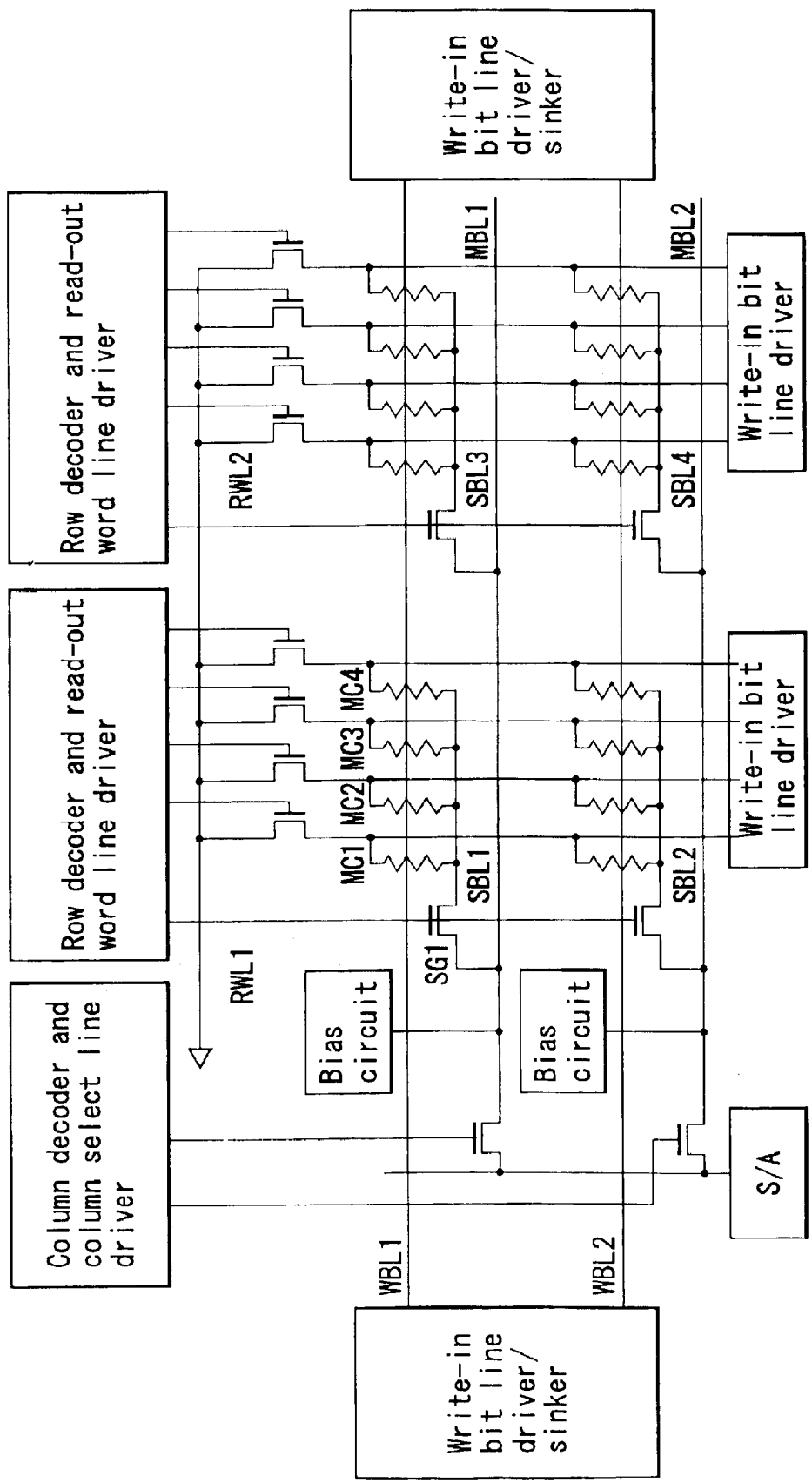
FIG. 3 is an equivalent circuit diagram of a magnetic random access memory (MRAM) of a reference example.

In this RAM, to preserve a cell-information read-out signal, a configuration shown in FIG. 1 is altered to introduce a hierarchical construction of a bit line in arranging a selection MOS transistor SG1 between a main-bit line MBL1 and a sub-bit line SBL1 as shown in FIG. 3. This makes it possible to selectively connect at least one of the plurality of thus divided sub-bit lines to the main-bit line. As a result, the number of selected cells connected to the bit line as viewed from a sense-amplifier can be reduced greatly.

A conventional cross-point type of memory cells has a problem that its non-selectivity of the memory cells causes a group of unselected memory cells to send an error signal to the sense-amplifier. To solve this problem, the MRAM shown in FIG. 3 reduces the effective number of memory cells which are connected to the bit line, for the purpose of suppressing the error signal.

Figure 4:
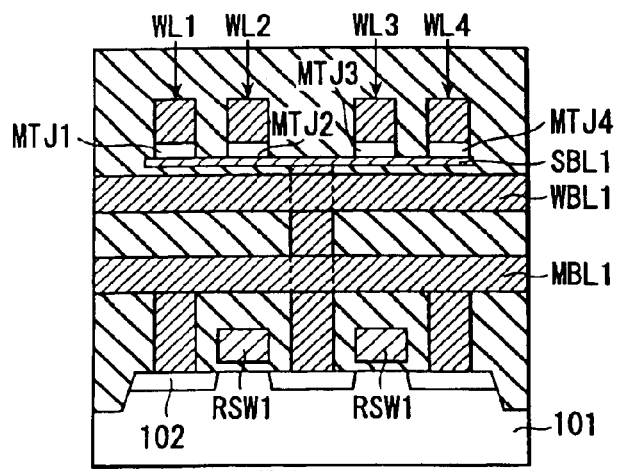
FIG. 4 is a cross-sectional view of a memory cell portion in the magnetic random access memory of the reference example.

One example of a cell cross-sectional structure of the MRAM shown in FIG. 3 is shown in FIG. 4.

Figure 2:
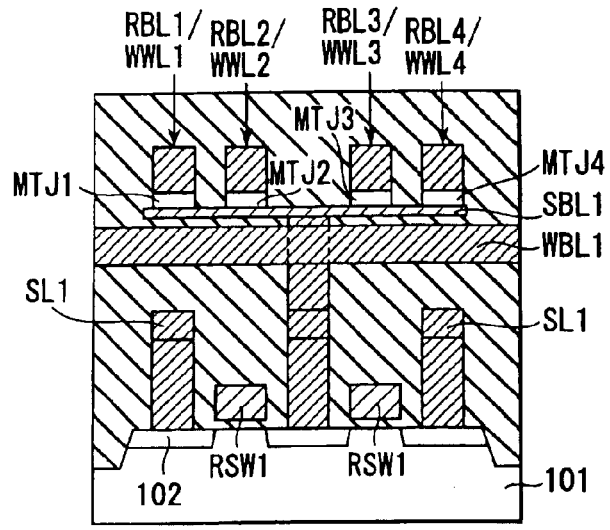
FIG. 2 is a cross-sectional view of a memory cell portion in the conventional magnetic random access memory.

In the cell cross section shown in FIG. 4, in comparison to that shown in FIG. 2, bit lines and word lines are replaced with each other, so that wiring lines which combine, in function, read-out bit lines (RBL1–RBL4) and write-in word line (WWL1–WWL4) which are arranged on an upper layer of MTJ elements in FIG. 2 are replaced by read-out/write-in word lines WL1–WL4 in FIG. 4. Furthermore, one of two nodes, that is, a source line SL1, of a selection MOS transistor in FIG. 2 is replaced by a dedicated read-out bit line MBL1 in FIG. 4.

However, in the MRAM having a structure shown in FIG. 4 also, the write-in bit line WBL1 is physically separated in wiring from the MRJ elements as described above. The write-in bit line WBL1 has a role of generating two magnetic fields having different directions in order to determine the alignment of a FREE layer of the MTJ element, so that the physical separation of the write-in bit line WBL1 and the MTJ elements may give rise to a suspected a decrease in intensity of an easy-axis directional write-in magnetic field applied on the MTJ elements, which is a key to information storage. Therefore, to solve it, a bit line current must be increased, thus leading to a problem of an increase in current dissipation.

The following will describe embodiments of the invention that solve the problems of the MRAM according to the above-mentioned reference example. In the description, the components common to all of the drawings are indicated by the common reference symbols.

A magnetic random access memory according to the embodiments of the invention comprises in construction an element which stores "1" or "0" information utilizing the Magneto-Resistive (MR) effects as a discrete memory cell. Furthermore, a plurality of the discrete memory cells are integrated and arranged in a matrix, in a periphery of which is there added a control circuit group including a decoder circuit and a sense circuit, thus enabling read-out and write-in operations by placing random access to an arbitrary bit.

The following will describe the embodiments with reference to a method for enabling interconnection of a write-in bit line and MTJ elements in a memory array in which cross-point type memory cells are arranged along the plurality of divided bit lines and, in addition, an optical method for interconnecting the main-bit line and the sub-bit line in this case. It is to be noted that although the following will exemplify a cross-point type memory cell composed of an MTJ element, the invention is not limited thereto; for example, the invention is applicable also to any other magneto-resistive elements capable of controlling the electrical resistance value magnetically.

First Embodiment

First, an MRAM according to a first embodiment of the invention is described below.

Figure 5:
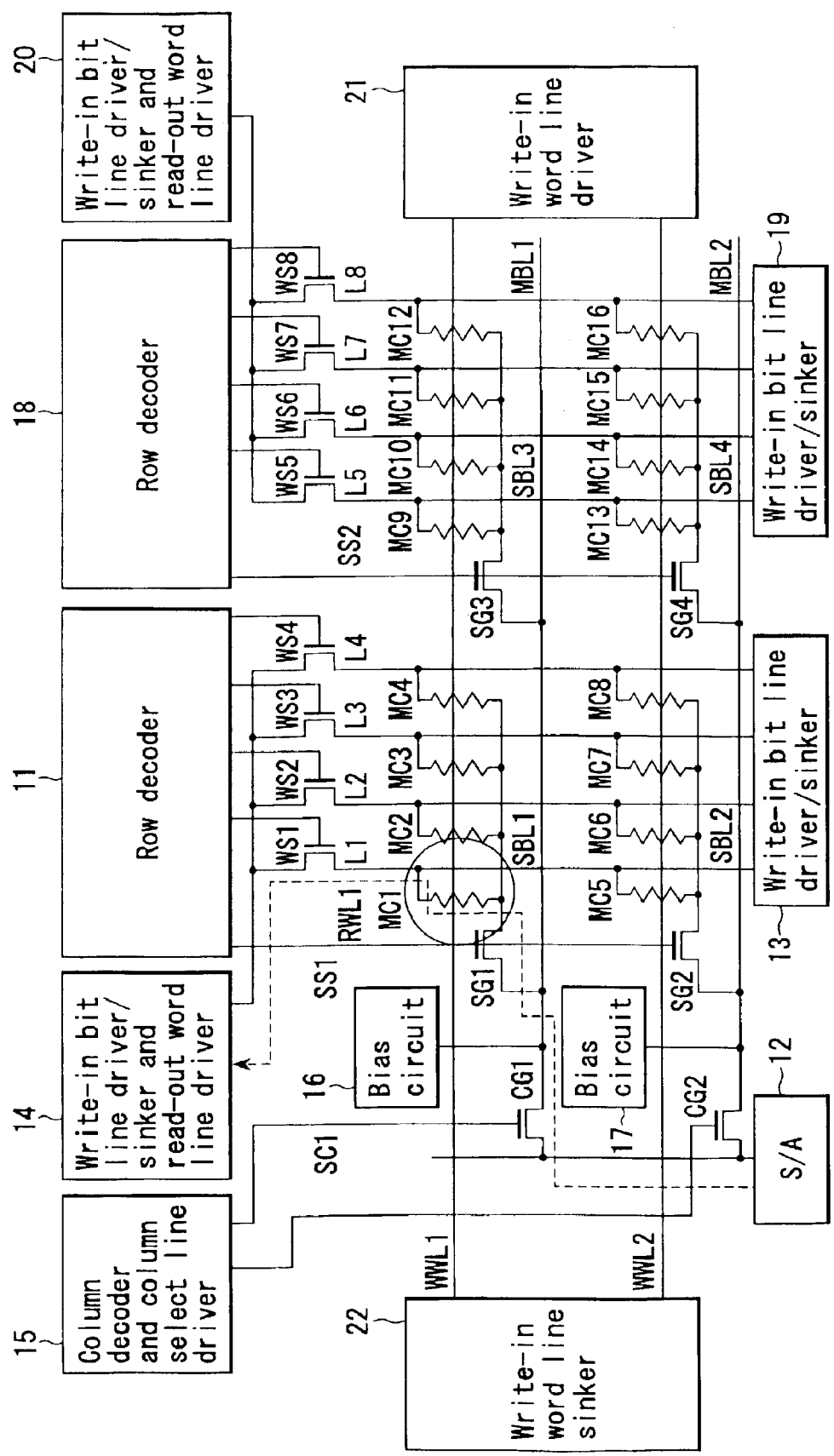
FIG. 5 is a circuit diagram which shows a flow of a signal in read-out of a magnetic random access memory according to a first embodiment of the invention.

FIG. 5 is a circuit diagram which shows a configuration of the MRAM according to the first embodiment.

As shown in FIG. 5, one ends of cross point-type memory cells MC1 through MC4 each comprising an MTJ element are connected to a sub-bit line SBL1, which is a common node. The sub-bit line SBL1 is connected to a main-bit line MBL1 via a selection MOS transistor SG1, which acts as a switch. To a gate of the selection MOS transistor SG1 is there connected a signal line SS1, which is in turn connected to a row decoder 11. One end of the main-bit line MBL1 is connected via a column gate circuit CG1 to a sense-amplifier (S/A) 12.

To the other ends of the above-mentioned memory cells MC1 through MC4 are there connected wiring lines L1 though L4 respectively. To one ends of the wiring lines L1 though L4 are there connected a write-in bit line driver/sinker 13. The other ends of the wiring lines L1 through L4 are connected via respective word line selection transistor WS1 through WS4 to a write-in bit line driver/sinker and read-out word line driver 14. Furthermore, gates of the word line selection transistor WS1 through WS4 are connected to the row decoder 11.

To a gate of the above-mentioned column gate circuit CG1 is there connected a signal line SC1, which is in turn connected to a column decoder and column select line (CSL) driver 15. Furthermore, to the main-bit line MBL1 is there connected a bias circuit 16.

One ends of the cross-point type memory cells MC5 through MC8 each comprising an MTJ element, on the other hand, are connected to a sub-bit line SBL2, which is a common node. This sub-bit line SBL2 is connected to a main-bit line SBL2 via a selection MOS transistor SG2, which acts as a switch. To a gate of the selection MOS transistor SG2 is there connected the signal line SS1. One end of the main-bit line MBL2 is connected via a column gate circuit CG2 to the sense-amplifier (S/A) 12. Furthermore, to the other ends of the memory cells MC5 through MC8 are there connected the above-mentioned wiring lines L1 through L4 respectively.

To a gate of the above-mentioned column gate circuit CG2 is there connected the column decoder and column select line driver 15. Furthermore, to the main-bit line MBL2 is there connected a bias circuit 17.

Similarly, one ends of cross point-type memory cells MC9 through MC12 each comprising an MTJ element are connected to a sub-bit line SBL3, which is a common node. This sub-bit line SBL3 is connected to the above-mentioned main-bit line MBL1 via a selection MOS transistor SG3, which acts as a switch. To a gate of the selection MOS transistor SG3 is there connected a signal line SS2, which is in turn connected to a row decoder 18.

To the other ends of the above-mentioned memory cells MC9 through MC12 are there connected wiring lines L5 though L8 respectively. To one ends of the wiring lines L5 though L8 is there connected a write-in bit line driver/sinker 19. The other ends of the wiring lines L5 through L8 are connected via respective word line selection transistor WS5 through WS8 to a write-in bit line driver/sinker and read-out word line driver 20. Furthermore, gates of the word line selection transistor WS5 through WS8 are connected to the row decoder 18.

Similarly again, one ends of cross point-type memory cells MC13 through MC16 each comprising an MTJ element are connected to a sub-bit line SBL4, which is a common node. The sub-bit line SBL4 is connected to the main-bit line MBL2 via a selection MOS transistor SG4, which acts as a switch. To a gate of the selection MOS transistor SG4 is there connected the signal line SS2. To the other ends of these memory cells MC13 through MC16 are there connected the above-mentioned wiring lines L5 through L8 respectively.

Furthermore, below the above-mentioned memory cells MC1 through MC4 and MC9 through MC12 is there arranged a write-in word line WWL1. To one end of the write-in word line WWL1 is there connected a write-in word line driver 21 and to the other end thereof, a write-in word line sinker 22. Furthermore, below the above-mentioned memory cells MC5 through MC8 and MC13 through MC16 is there arranged a write-in word line WWL2. To one end of the write-in word line WWL2 is there connected the write-in word line driver 21 and to the other end thereof, the write-in word line sinker 22.

Although FIG. 5 shows the memory cells MC1 through MC16 as an example, in an actual MRAM the memory cells are there integrated and arranged two-dimensionally appropriately. Furthermore, although the example shows a 4-bit memory cell being connected to each of the divided sub-bit lines SBL1 through SBL4, the number of bits of each memory cell to be connected may also be changed appropriately, including four, eight, or any other number of bits, for example.

The following will describe read-out operations of the MRAM according to the first embodiment with reference to FIG. 5.

It is here supposed that information stored in the memory cell MC1 is read out. First, the wiring line L1 is selectively set to a low voltage level by the row decoder 11. Furthermore, the signal line SS1 is supplied with the HIGH level by the row decoder 11, to turn ON the selection MOS transistor SG1 between the sub-bit line SBL1 and the main-bit line MBL1.

Besides, the signal line SC1 is supplied with the HIGH level by the column decoder and column select line driver 15, to turn ON the column gate circuit CG1 between the main-bit line MBL1 and the sense-amplifier 12.

In such a manner, a current is selectively flown from the main-bit line MBL1 to the wiring line L1 (read-out word line RWL1) via the selection MOS transistor SG1 between the sub-bit line SBL1 and the main-bit line MBL1. This causes the information stored in the selected memory cell MC1 to be read out from the main-bit line MBL1 to the sense-amplifier 12. Furthermore, the information read out to the sense-amplifier 12 is sensed and amplified to be output thereby. Thus, in read-out, the wiring line L1 functions as a read-out word line RWL.

Figure 6:
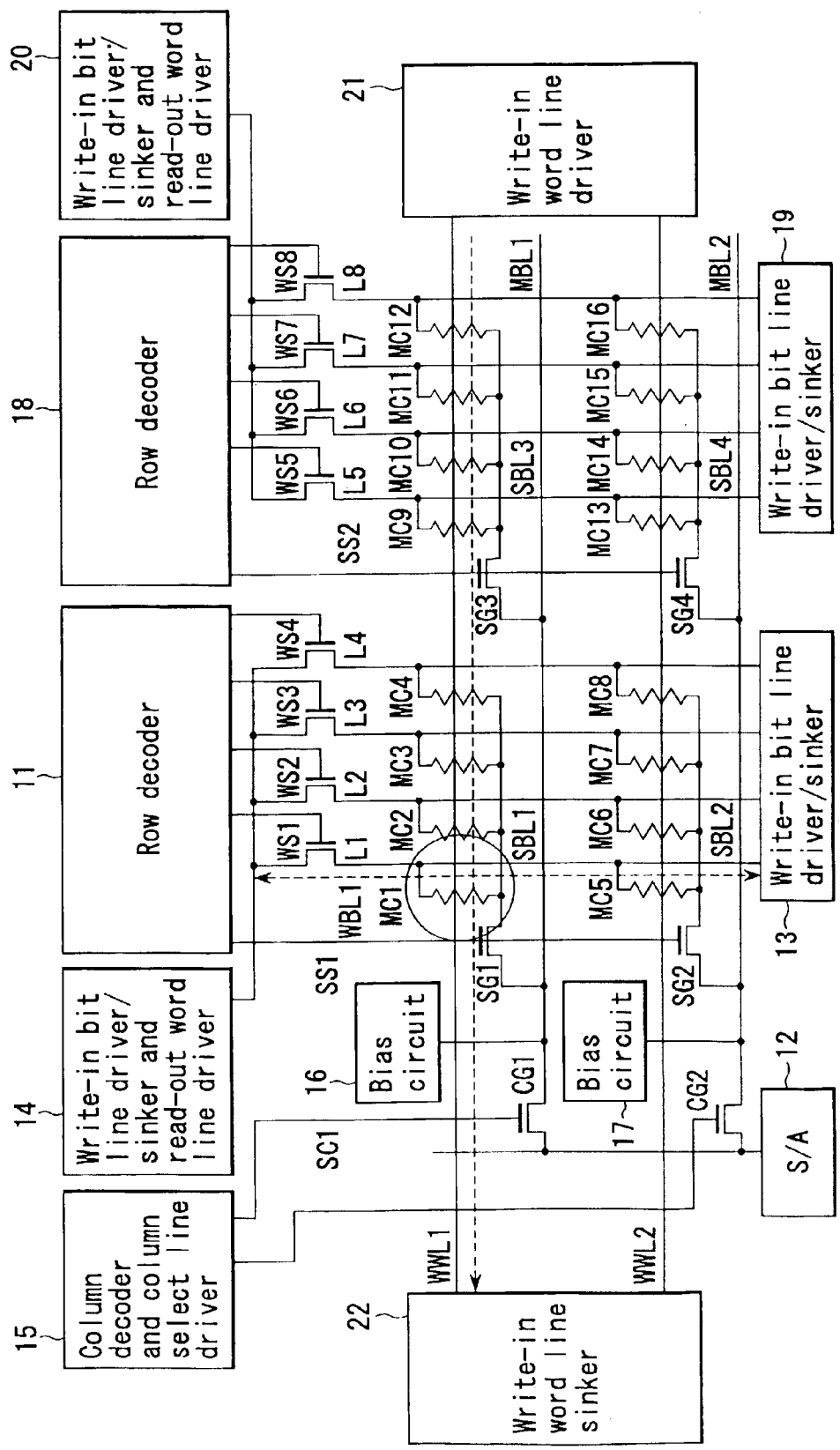
FIG. 6 is a circuit diagram which shows a flow of a signal in write-in of the magnetic random access memory according to the first embodiment of the invention.

Next, write-in to the MRAM according to the above-mentioned first embodiment is described with reference to FIG. 6. FIG. 6 is a circuit diagram which shows write-in to the MRAM according to the above-mentioned first embodiment.

It is here supposed that information is written into the memory cell MC1. In the write-in operation, the main-bit line MBL1 is not used, so that the signal line SS1 is supplied with the LOW level by the row decoder 11, to make nonconductive the selection MOS transistor SG1 between the main-bit line MBL1 and the sub-bit line SBL1.

In this state, by flowing a current through the write-in word line WWL1 which is arranged in the same direction as the main-bit line MBL1, a magnetic field is generated in a direction which interconnects the row decoder 11 and the bit-line driver/sinker 13 in the figure, that is, a direction which is perpendicular to the write-in word line WWL1. To flow the current through the write-in word line WWL1, at one end thereof is there arranged the write-in word line driver 21 and at the other end thereof, the write-in word line sinker 22. In the present embodiment, the current is flown in a direction from the word line driver 21 to the word line sinker 22.

Furthermore, in order to carry out two-axial write-in, a current is flown also through the wiring line L1 which is arranged opposite the sub-bit line SBL1 with respect to the memory cell MC1, to generate a magnetic field in a direction which interconnects the word line driver 21 and the word line sinker 22 in the figure, that is, a direction which is parallel to the write-in word line WWL1. In accordance with information to be written in and the direction in which the current is flown through the wiring line L1, the direction of a magnetic domain of a FREE layer in an MTJ element that constitutes the memory cell MC1 must be controlled to alter the resistance value of the MTJ element. For this purpose, to one end and the other end of the wiring line L1 are there arranged the bit line driver/sinker 13 and the bit line driver/sinker 14 respectively so that a current can be flown bi-directionally between the write-in bit line driver/sinker 13 and the write-in bit line driver/sinker 14. In such a manner, the wiring line L1 functions as the write-in bit line WBL1 which determines information to be written in the write-in mode.

Figure 7:
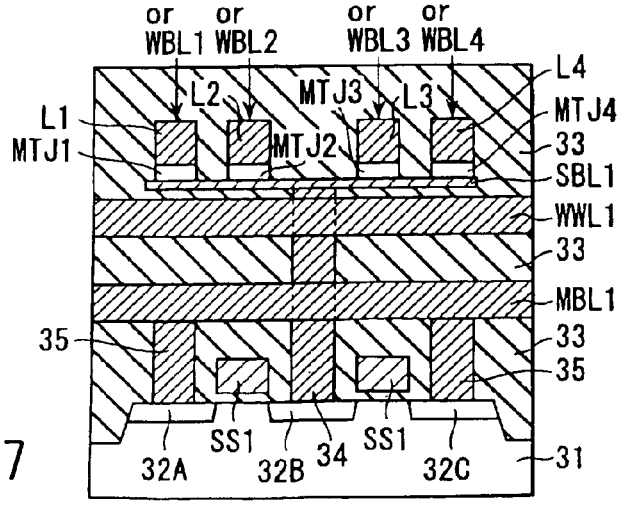
FIG. 7 is a cross-sectional view of a memory cell portion in the magnetic random access memory of the first embodiment.

A cross-sectional view of the memory cell portion in the MRAM of the present first embodiment is shown in FIG. 7. As shown in FIG. 7, on a semiconductor substrate 31 are there formed source/drain diffusion layers 32A, 32B, and 32C of the selection MOS transistor SG1 as isolated from each other. On the diffusion layer 32B is there formed a contact plug 34 as buried in an insulation film 33, on which contact plug 34 is there formed the sub-bit line SBL1.

On the sub-bit line SBL1 are there formed MTJ elements of MTJ1, MTJ2, MTJ3, and MTJ4 which are stacked upward in an order of a PIN layer, an insulation layer, and a FREE layer. Furthermore, on these MTJ elements of the MTJ1 through MTJ4 are there formed the wiring lines L1 through L4 respectively.

Between the diffusion layers 32A and 32B and between the diffusion layers 32B and 32C is there formed the gate (signal line SS1) of the selection MOS transistor SG1. These diffusion layers 32A, 32B, and 32C and the signal line SS1 comprise the selection MOS transistor SG1.

On these diffusion layers 32A and 32C is there formed a contact plug 35. On these contact plugs 35 is there formed the main-bit line MBL1. Furthermore, above the main-bit line MBL1 is there formed the write-in word line WWL1 via the insulation film 33.

In a cross-sectional structure shown in FIG. 7, the write-in word line WWL1 is a wiring line provided to generate a magnetic field in a hard-axis direction of a FREE layer in the MTJ elements of MTJ1 through MTJ4. Furthermore, the wiring line L1 is provided to generate a magnetic field in an easy-axis direction of the FREE layer in the MTJ elements of MTJ1 through MTJ4, functioning as the read-out word line RWL1 or the write-in bit line WBL1. That is, the wiring line L1 acts as a word line which functions as a word line to select a memory cell in the read-out mode and as a bit line to control information to be written in the write-in mode. Similarly, the wiring lines L2 through L4 function as the read-out word line RWL2 or the write-in bit line WBL2, the read-out word line RWL3 or the write-in bit line WBL3, or the read-out word line RWL4 or the write-in bit line WBL4 respectively.

As described above, in the first embodiment, the wiring line which is arranged opposite the sub-bit line (divided bit line) with respect to the MTJ element is caused to function as a word line in the read-out mode and as a bit line in the write-in mode. In such a manner, it is possible to provide such a configuration that the write-in bit line WBL1 which has a role of generating two magnetic fields having different directions in order to determine the alignment of a FREE layer of the MTJ element is physically connected with the MTJ element of MTJ1 in the memory cell MC1, which has been impossible with the conventional MRAM. It is thus possible to avoid a decrease in intensity of the easy-axis directional write-in magnetic field applied on the MTJ elements, which is a key to information storage.

Second Embodiment

The following will describe an MRAM according to a second embodiment of the invention.

Figure 8:
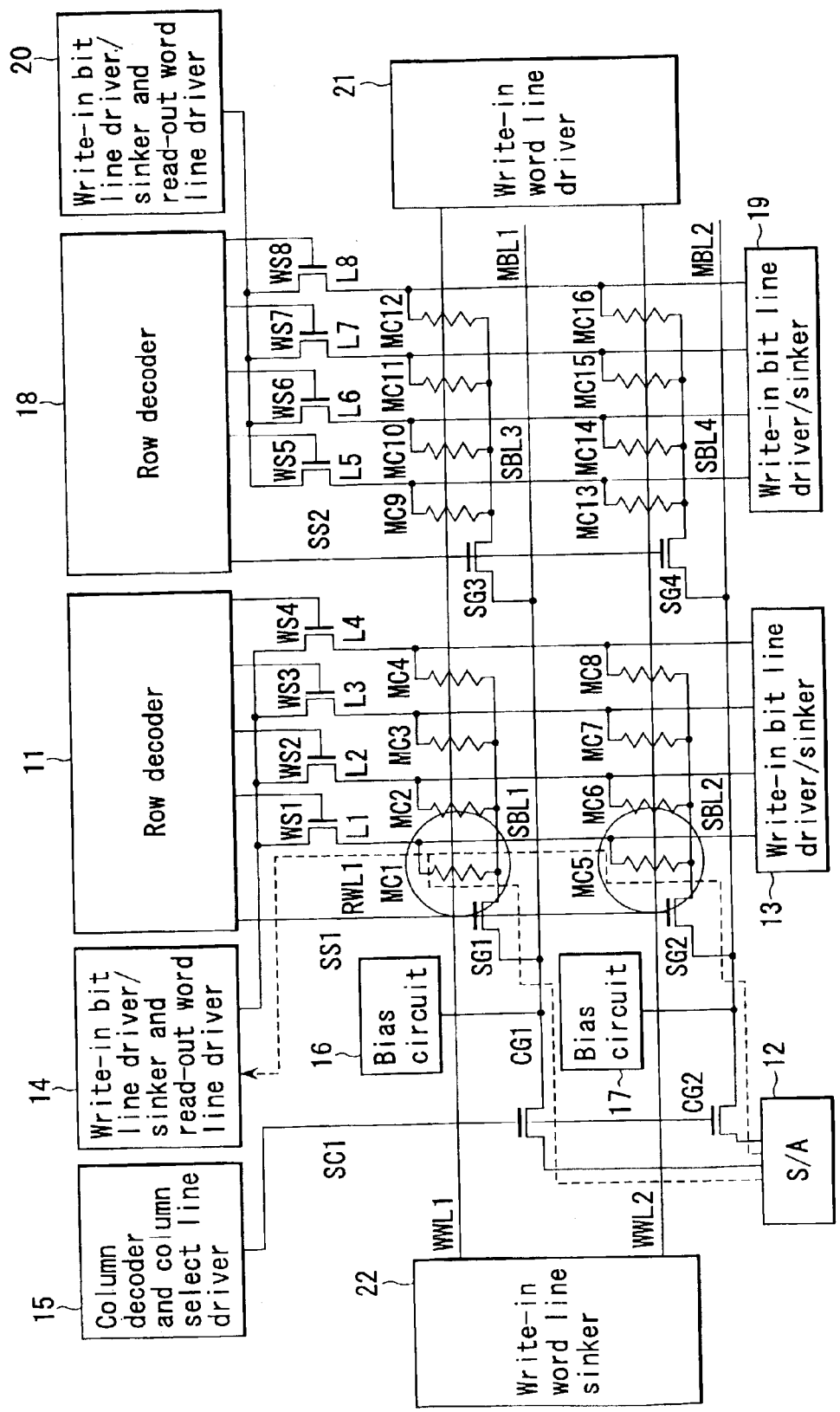
FIG. 8 is a circuit diagram which shows a flow of a signal in read-out of a magnetic random access memory according to a second embodiment of the invention.

FIG. 8 is a circuit diagram which shows a configuration of the MRAM according to the second embodiment. The second embodiment is different from the above-mentioned first embodiment shown in FIG. 5 in that in contrast to the first embodiment in which one-bit information is stored in one memory cell, in the second embodiment, one-bit information is stored in two memory cells (that is, two-bit/cell system). The components of the second embodiment which are similar to those of the above-mentioned first embodiment are indicated by the same reference symbols and so their explanation is omitted, to describe only the different components below.

As shown in FIG. 8, to gates of column gate circuits CG1 and CG2 is there connected a signal line SC1 commonly. The other components are the same as those of the above-mentioned first embodiment.

The MRAM of the present second embodiment operates as follows.

In the read-out mode, signal lines SS1 and SC1 are driven to the high voltage level, to turn ON selection MOS transistors SG1 and SG2 and the column gate circuits CG1 and CG2. Furthermore, a word line selection transistor WS1 is turned ON by a row decoder 11. Then, a read-out word line RWL1 (wiring line L1) is driven to the low voltage level by a read-out word line driver 14. Thus, data which is stored in memory cells MC1 and MC5 in which two complementary data bits are written is read out to a main-bit line pair (MBL1/MBL2) via sub-bit lines SBL1 and SBL2.

The data thus read out to the main-bit line pair is transferred unchanged as complementary data to a sense-amplifier (S/A) 12 via the column gate circuits CG1 and CG2. Furthermore, the complementary data thus transferred is sensed and amplified by the sense-amplifier 12 and read out to, for example, an outside of a chip.

Figure 9A:
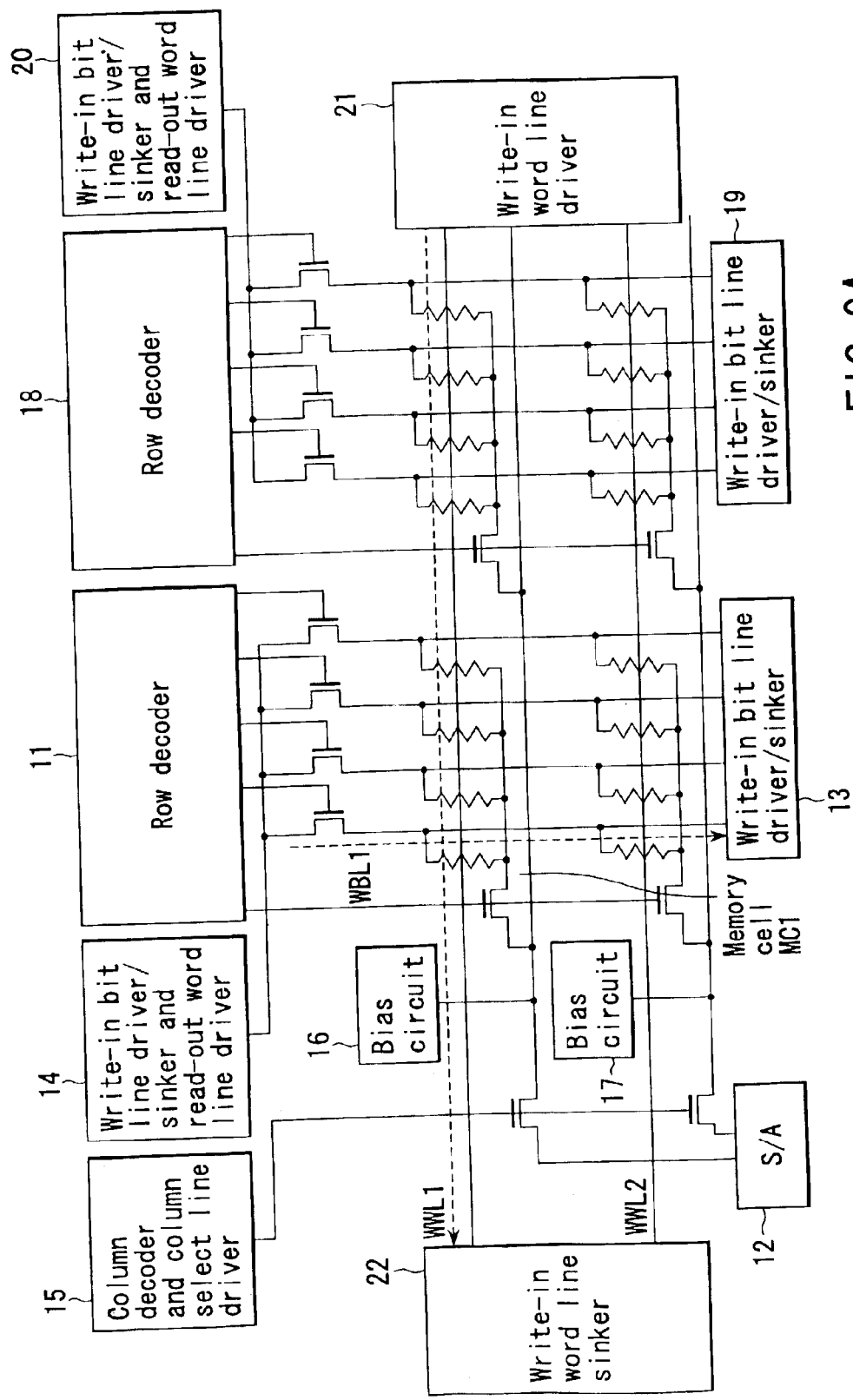
FIGS. 9A and 9B are circuit diagrams which show a flow of a signal in write-in of the magnetic random access memory according to the second embodiment of the invention.
Figure 9B:
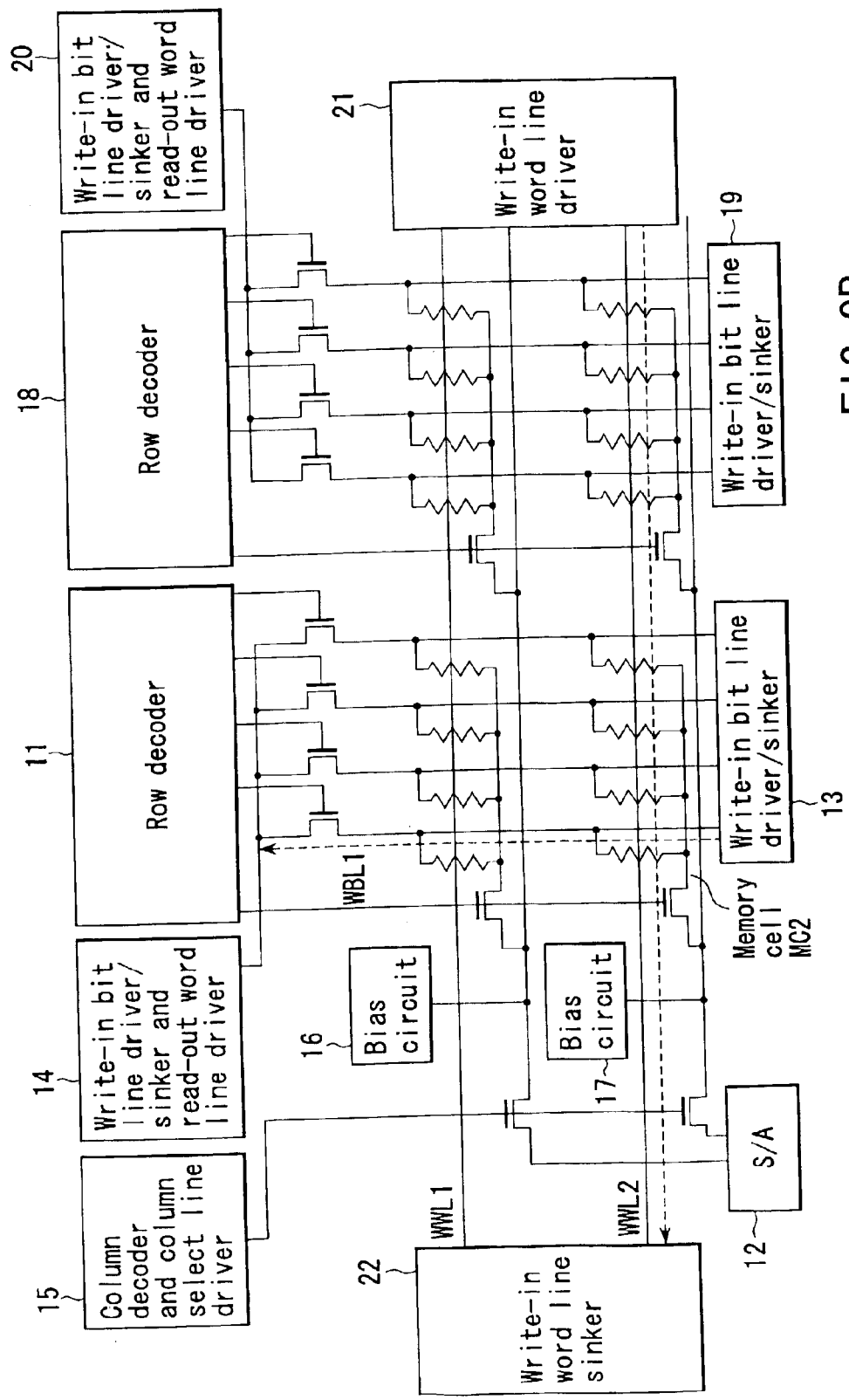

In the write-in mode, on the other hand, as shown in FIGS. 9A and 9B, two write-in operations are required. This is because it is necessary to write data items which are complementary to each other into respective two bits of memory cells MC1 and MC2 which are to be selected of those connected to one write-in bit line WBL1 by flowing currents having different directions through the write-in bit line WBL1.

In a first write-in cycle shown in FIG. 9A, a current is flown through the write-in bit line WBL1 in a direction from a bit line driver/sinker 14 to a bit line driver/sinker 13 and also, through a write-in word line WWL1. Thus, write-in (two-axial write-in) to the memory cell MC1 is completed.

Thereafter, in a second write-in cycle shown in FIG. 9B, a current which is flown through the write-in bit line WBL1 is switched in a direction from the bit line driver/sinker 13 to the bit line driver/sinker 14, while at the same time a current is flown through a write-in word line WWL2 in place of the write-in word line WWL1. Thus, write-in to the memory cell MC2 is completed. In such a manner, two write-in cycles are used to write complementary data items into the memory cells MC1 and MC2 respectively.

As described above, in the second embodiment, even in the case of a two-cell/bit system by which one-bit data is stored in two memory cells, a wiring line which is arranged opposite a sub-bit line (divided bit line) with respect to an MTJ element is caused to function as a word line in the read-out mode and as a bit line in the write-in mode. In such a manner, it is possible to provide such a configuration that the write-in bit line WBL1 which has a role of generating two magnetic fields having different directions in order to determine the alignment of a FREE layer of the MTJ element is physically connected with the MTJ element of MTJ1 in the memory cell MC1, which has been impossible with the conventional MRAM. It is thus possible to avoid a decrease in intensity of the easy-axis directional write-in magnetic field applied on the MTJ elements, which is a key to information storage.

Third Embodiment

The following will describe an MRAM according to a third embodiment of the invention.

Figure 10:
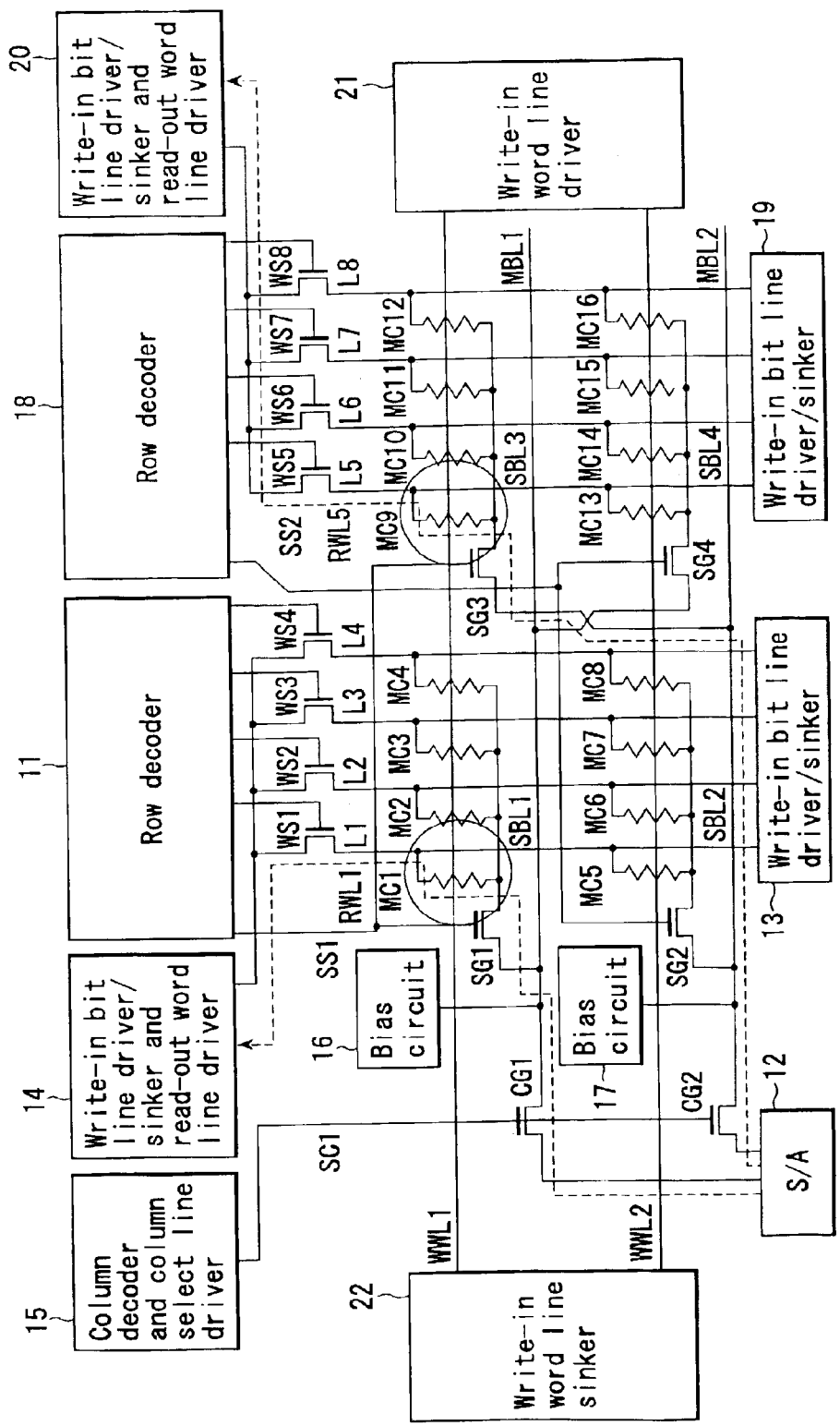
FIG. 10 is a circuit diagram which shows a flow of a signal in read-out of a magnetic random access memory according to a third embodiment of the invention.

FIG. 10 is a circuit diagram which shows a configuration of the MRAM according to the third embodiment. In contrast to the above-mentioned second embodiment in which two write-in cycles are required to write in complementary data, by this third embodiment, write-in of complementary data can be completed in one cycle.

In contrast to the above-mentioned second embodiment in which a signal line SS1 is connected to gates of selection MOS transistor SG1 and SG2, in the third embodiment, the signal line SS1 is connected to gates of the selection MOS transistors SG1 and SG3. Furthermore, in contrast to the above-mentioned second embodiment in which one end of the current path of the selection MOS transistor SG3 is connected to a main-bit line MBL1 and one end of the current path of a selection MOS transistor SG4 is connected to a main-bit line MBL2, in the third embodiment, one end of the current path of the selection MOS transistor SG3 is connected to the main-bit line MBL2 and one end of the current path of the selection MOS transistor SG4 is connected to the main-bit line MBL1. The components of the third embodiment which are similar to those of the above-mentioned second embodiment are indicated by the same reference symbols and so their explanation is omitted, to describe only the different components below.

The following will describe write-in to the MRAM of the third embodiment with reference to FIG. 10. It is here supposed that information stored in memory cells MC1 and MC9 is read out.

First, to selectively connect sub-bit lines SBL1 and SBL3 including the memory cells MC1 and MC9 to be selected to the main-bit lines MBL1 and MBL2 respectively, the signal SS1 is driven to the high voltage level to turn ON the selection MOS transistors SG1 and SG3. Also, a signal line SC1 is driven to the high voltage level to turn ON column gate circuits CG1 and CG2. Furthermore, a word line selection transistor WS1 is turned ON by a row decoder 11, while a word line selection transistor WS5 is turned ON by a row decoder 18. Then, two read-out word lines RWL1 (wiring line L1) and RWL5 (wiring line L5) respectively including the memory cells MC1 and MC5 to be accessed are set to the low voltage level.

In such a manner, information items stored in the two memory cells MC1 and MC5 which are arranged on the same write-in word line WWL1 are read out to the main-bit line pair of MBL1 and MBL2 via the sub-bit lines SBL1 and SBL2 respectively. In this case, as described above, by connecting the sub-bit line SBL1 to the main-bit line MBL1 and connecting the sub-bit line SBL3 to the main-bit line MBL2, two data bits stored in the memory cells are avoided from colliding with each other on the main-bit line pair of MBL1 and MBL2.

Thereafter, as in the case of the second embodiment, the data read out to the main-bit line pair is transferred unchanged as complementary data to the sense-amplifier (S/A). Furthermore, the data thus transferred is sensed and amplified by the sense-amplifier 12 and read out to, for example, an outside of a chip.

Figure 11:
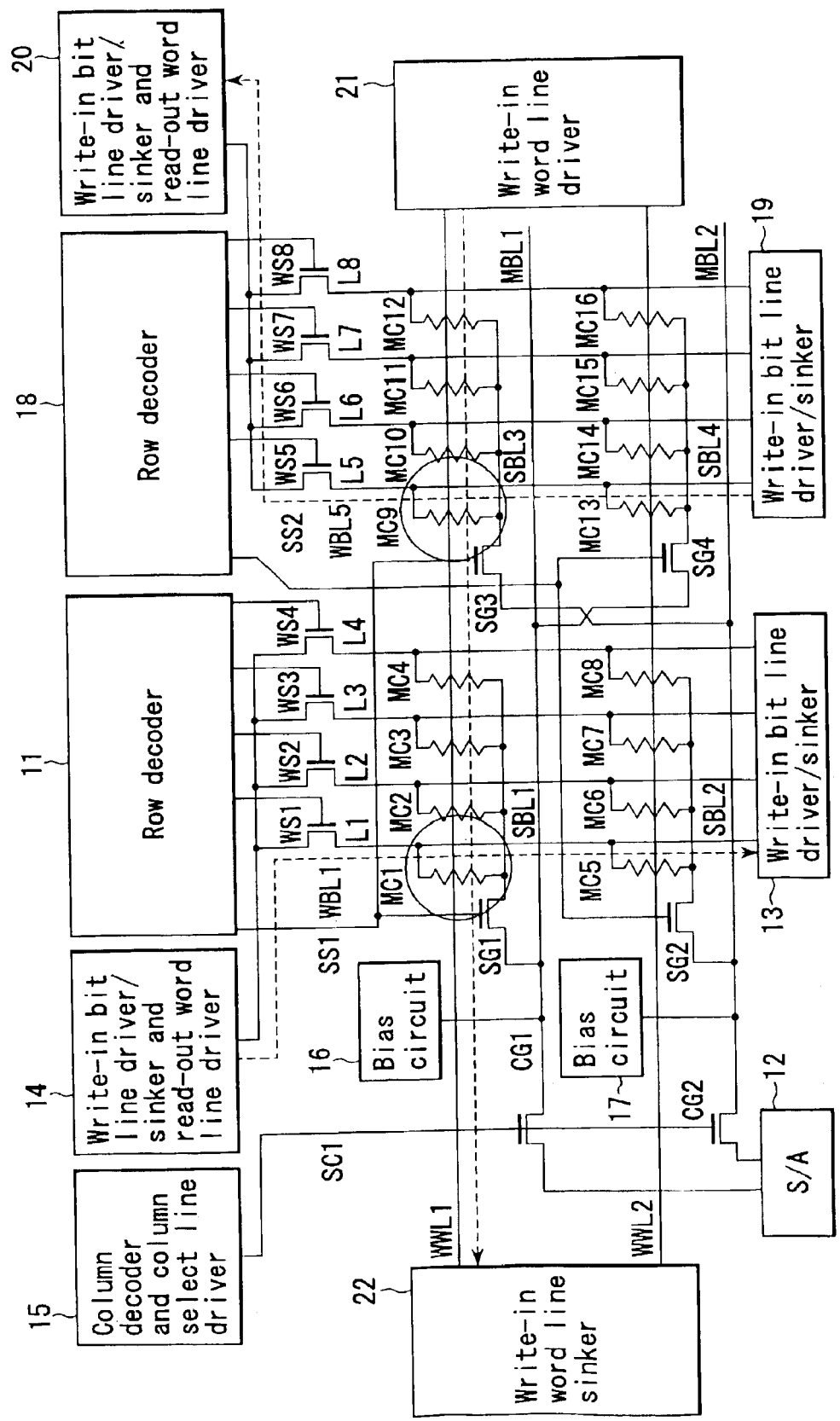
FIG. 11 is a circuit diagram which shows a flow of a signal in write-in of the magnetic random access memory according to the third embodiment of the invention.

The following will describe write-in operations to the MRAM of the third embodiment with reference to FIG. 11. FIG. 11 is a circuit diagram which shows write-in to the MRAM of the third embodiment.

In the following, a case where complementary data is written into the memory cells MC1 and MC5 is described. As shown in FIG. 11, write-in bit lines WBL1 and WBL5 for the memory cells MC1 and MC5 to be selected are divided independently of each other, with the write-in word line WWL1 being common to them.

In this configuration, for example, a current is flown through the write-in word line WWL1 in a direction from a write-in word line driver 21 to a write-in word line sinker 22. At the same time, a current is flown through the write-in bit line WBL1 in a direction from a bit line driver/sinker 14 to a bit line driver/sinker 13, while a current is flown through the write-in bit line WBL5 in a direction from a bit line driver/sinker 19 to a bit line driver/sinker 20. It is thus possible to complete write-in of two complementary data bits to the respective memory cells MC1 and MC5 in one write-in cycle.

In the third embodiment, by addressing, as a memory cell pair which stores complementary data, two bits of memory cells which are arranged at interconnections of such common write-in word line WWL and the mutually independent write-in bit lines WBL1 and WBL5 respectively, it is possible to write complementary data items into two memory cells in one write-in operation.

Figure 12:
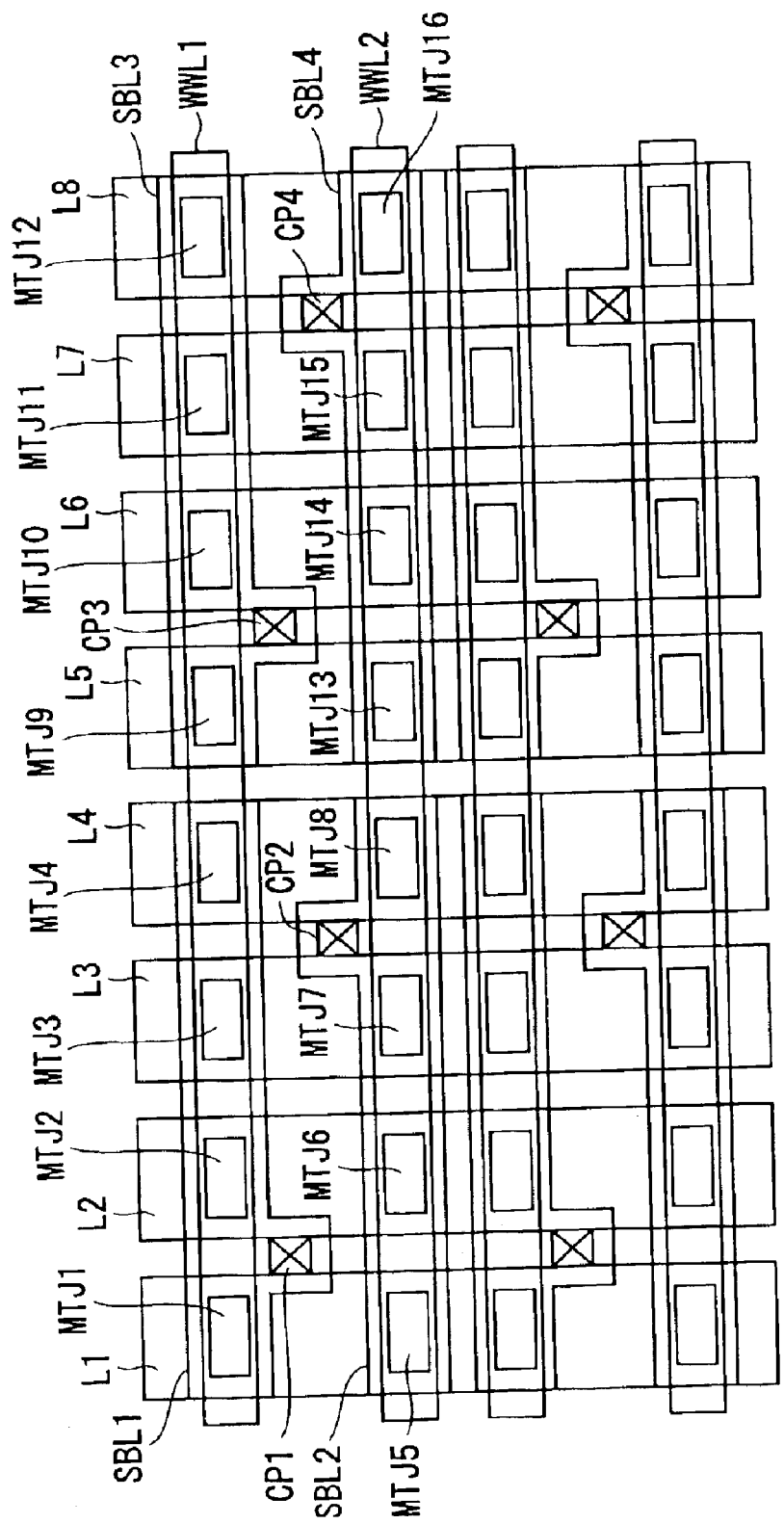
FIG. 12 is a layout which shows mainly an MTJ element of a memory cell portion in the magnetic random access memory of the third embodiment.
Figure 13:
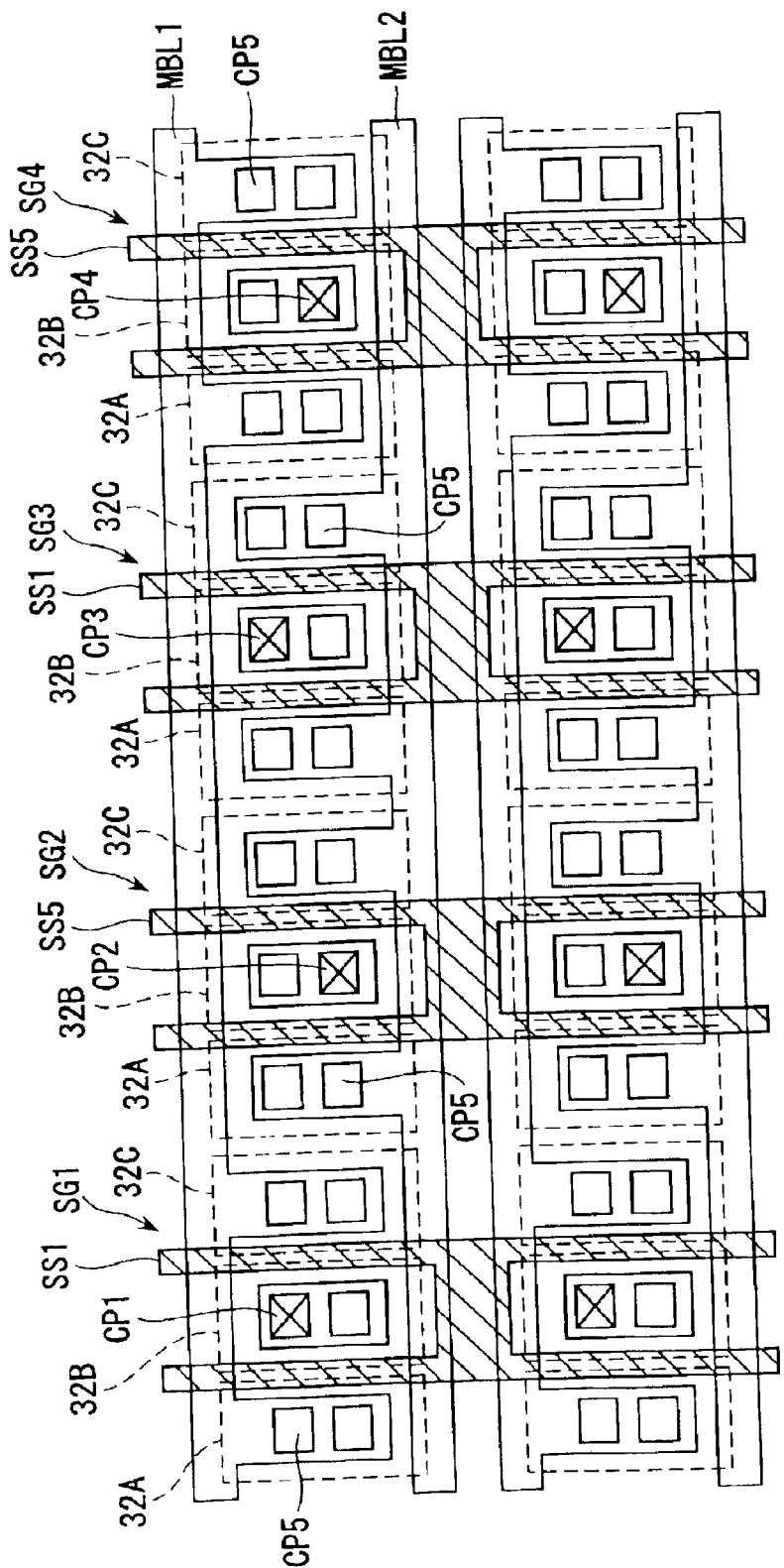
FIG. 13 is a layout which shows mainly a selection MOS transistor of the memory cell portion in the magnetic random access memory of the third embodiment.

Next, layouts of memory cell portions in the MRAM of the third embodiment are shown in FIGS. 12 and 13.

FIG. 12 is a plan view which shows mainly the memory cells MC1 through MC16 including MTJ elements of MTJ1 through MTJ16 respectively and FIG. 13, a plan view which shows mainly the selection MOS transistors SG1 through SG4.

As shown in FIG. 12, the MTJ elements of MTJ1 through MTJ16 are integrated and arranged two-dimensionally. Furthermore, the sub-bit line SBL1 is arranged, which is a wiring line common to the MTJ elements of MTJ1 though MTJ4 accommodating four bits. Similarly, the sub-bit line SBL2 is arranged, which is a wiring line common to the MTJ elements of MTJ5 through MTJ8, the sub-bit line SBL3 is arranged, which is a wiring line common to the MTJ elements of MTJ9 through MTJ12, and the sub-bit line SBL4 is arranged, which is a wiring line common to the MTJ elements of MTJ13 through MTJ16.

Above the MTJ elements of MTJ1 and MTJ5 is there arranged the wiring line L1 connected thereto. Similarly, above the MTJ elements of MTJ2 and MTJ6 is there arranged a wiring line L2, above the MTJ elements of MTJ3 and MTJ7 is there arranged a wiring line L3, and above the MTJ elements of MTJ4 and MTJ8 is there arranged a wiring line L4. Furthermore, above the MTJ elements of MTJ9 and MTJ13 is there arranged a wiring line L5, above the MTJ elements of MTJ10 and MTJ14 is there arranged a wiring line L6, above the MTJ elements of MTJ11 and MTJ15 is there arranged a wiring line L7, and above the MTJ elements of MTJ12 and MTJ16 is there arranged a wiring line L8. These wiring lines L1 through L8 function as a read-out word line in the read-out mode and as a write-in bit line in the write-in mode.

Furthermore, the write-in word line WWL1 is arranged in parallel to the sub-bit lines SBL1 and SBL3 below the MTJ elements of MTJ1 through MTJ4 and the MTJ elements of MTJ9 through MTJ12 respectively. A write-in word line WWL2 is arranged in parallel to the sub-bit lines SBL2 and SBL4 below the MTJ elements of MTJ5 through MTJ8 and the MTJ elements of MTJ13 through MTJ16 respectively.

The sub-bit line SBL1 is connected via a contact plug CP1 arranged between the wiring lines L1 and L2 to a source/drain diffusion layer 32B of the selection MOS transistor SG1 shown in FIG. 13. The sub-bit line SBL2 is connected via a contact plug CP2 arranged between the wiring lines L3 and L4 to the source/drain diffusion 32B of the selection MOS transistor SG2. The sub-bit line SBL3 is connected via a contact plug CP3 arranged between the wiring lines L5 and L6 to the source/drain diffusion 32B of the selection MOS transistor SG3. Furthermore, the sub-bit line SBL4 is connected via a contact plug CP4 arranged between the wiring lines L7 and L8 to the source/drain diffusion 32B of the selection MOS transistor SG4.

In each of the regions of the selection MOS transistors SG1 through SG4, diffusion layers 32A and 32C are arranged as separated from the diffusion layer 32B. The signal line SS1, which is a gate, is arranged between the diffusion layers 32A and 32B and between the diffusion layers 32B and 32C of each of the selection MOS transistor SG1 and SG3. Furthermore, a signal line SS5, which is a gate, is arranged between the diffusion layers 32A and 32B and between the diffusion layers 32B and 32C of each of the selection MOS transistors SG2 and SG4.

The main-bit line MBL1 is connected via a contact plug CP5 to the diffusion layers 32A and 32C of each of the selection MOS transistors SG1 and SG4. Furthermore, the main-bit line MBL2 is connected via the contact plug CP5 to the diffusion layers 32A and 32C of each of the selection MOS transistors SG2 and SG3.

It is to be noted that by separating from each other a region in which the MTJ elements accommodating four bits which are connected to the same sub-bit line are arranged and a region in which the selection MOS transistors are arranged as shown in FIGS. 12 and 13, it is possible to increase the degree of freedom of interconnection of the selection MOS transistors and the main-bit line. As a result, it is possible to connect the other end of the diffusion layer of the selection MOS transistor to either one of the main-bit line pair, thus connecting the sub-bit line to the main-bit line in such a manner that they may intersect with each other, without introducing a new wiring line layer, as shown in FIGS. 12 and 13.

Furthermore, it is also possible to implement wiring such as shown in FIGS. 12 and 13 by alternately wiring the two signal lines SS1 and SS5, which are a gate wiring line of the selection MOS transistors.

Figure 14:
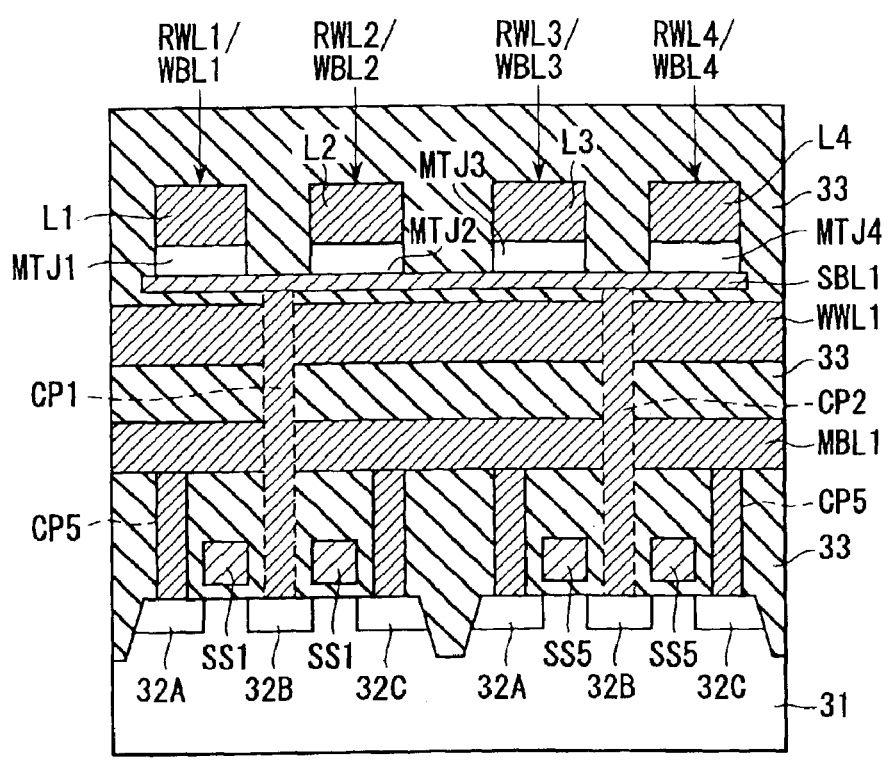
FIG. 14 is a cross-sectional view of the memory cell portion in the magnetic random access memory of the third embodiment.

Next, a cross-sectional structure of a memory cell portion in the MRAM of the third embodiment is shown in FIG. 14.

As shown in FIG. 14, on a semiconductor substrate 31 are there formed source/drain diffusion layers 32A, 32B, and 32C of the selection MOS transistors SG1 and SG5 as isolated from each other. On the diffusion layer 32B are there formed the contact plugs CP1 and CP2 as buried in an insulation film 33. On the contact plug CP1 is there formed the sub-bit line SBL1.

On this sub-bit line SBL1 are there formed the MTJ elements of MTJ1, MTJ2, MTJ3, and MTJ4 which are stacked upward in an order of a PIN layer, an insulation layer, and a FREE layer. Furthermore, on these MTJ elements of the MTJ1 through MTJ4 are there formed the wiring lines L1 through L4 respectively.

Over the channel regions between the diffusion layers 32A and 32B and between the diffusion layers 32B and 32C is there formed the gate (signal line SS1) of the selection MOS transistor SG1 or the gate (signal line SS5) of the selection MOS transistor SG2. These diffusion layers 32A, 32B, and 32C and the signal line SS1 comprise the selection MOS transistor SG1, while the diffusion layers 32A, 32B, and 32C and the signal line SS5 comprise the selection MOS transistor SG2.

On these diffusion layers 32A and 32C is there formed the contact plug CP5. On these contact plugs CP5 is there formed the main-bit line MBL1 or an MBL5 not shown. Furthermore, above the main-bit line MBL1 is there formed the write-in word line WWL1 via the insulation film 33.

As described above, in the third embodiment, as in the case of the above-mentioned second embodiment, in the case of a two-cell/bit system by which one-bit data is stored in two memory cells, a wiring line which is arranged opposite a sub-bit line (divided bit line) with respect to an MTJ element is caused to function as a word line in the read-out mode and as a bit line in the write-in mode. In such a manner, it is possible to provide such a configuration that the write-in bit line WBL1 which has a role of generating two magnetic fields having different directions in order to determine the alignment of a FREE layer of the MTJ element is physically connected with the MTJ element of MTJ1 in the memory cell MC1, which has been impossible with the conventional MRAM. It is thus possible to avoid a decrease in intensity of the easy-axis directional write-in magnetic field applied on the MTJ elements, which is a key to information storage. Furthermore, by completing write-in of complementary data in one write-in cycle in the case of the two-cell/bit system, the write-in speed can be increased.

By the embodiments of the invention, in a magnetic random access memory which uses a cross-point type memory cell and employs a sub-bit line (divided bit line) construction, one end of the memory cell is connected to the sub-bit line and the other thereof, to a plurality of wiring line layers which are separated from each other independently. These wiring line layers are configured to act as a read-out word line in the memory-cell read-out mode and as a write-in bit line in the memory-cell write-in mode. Therefore, it is possible to provide such a configuration that the write-in bit line which has a role of generating two magnetic fields having different directions in order to determine the alignment of a FREE layer of the MTJ element is physically connected with the MTJ element. As a result, it is possible to avoid a decrease in intensity of the easy-axis directional write-in magnetic field applied on the MTJ elements, which is a key to information storage, thus implementing a low-power dissipation MRAM.

Furthermore, in the case of a two-cell/bit system by which two memory cells are used to store each one-bit data, at least each two sub-bit lines connected to a main-bit line pair are arranged on the same write-in word line in configuration. Therefore, it is possible to decrease a write-in current and also to realize simultaneous write-in to the two memory cells that correspond to one-bit information. Accordingly, it is possible to implement a lower-power dissipation magnetic random access memory capable of high-speed write-in operations.

As described above, by the embodiments of the invention, by interconnecting a write-in bit line and an MTJ element, it is possible to provide a magnetic random access memory which can decrease a bit line current to reduce power dissipation.

It is to be noted that the above-mentioned embodiments can be implemented not only independently of each other but also in combination. Furthermore, the above-mentioned embodiments has a variety of stages of invention, so that these stages can be extracted by appropriately combining the plurality of components disclosed in these embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetic random access memory comprising:
   a memory cell including a magneto-resistive element of which electrical resistance is altered by magnetism;
   a sub-bit line which is connected to one end of the memory cell;
   a main-bit line which is connected to the sub-bit line via a first selection circuit;
   a sense-amplifier which is connected to the main-bit line via a second selection circuit;
   a wiring line which is connected to the other end of the memory cell and disposed in a first direction;
   a first operation circuit which is connected to one end of the wiring line via a third selection circuit;
   a second operation circuit which is connected to the other end of the wiring line; and
   a word line which passes through an interconnection point between the memory cell and the wiring line and is disposed orthogonal to the first direction, wherein:
   during a read-out operation of reading out data from the memory cell, the first operation circuit acts as a word line driver so that the wiring line may provide a read-out word line; and
   during a write-in operation of writing data into the memory cell, the first operation circuit acts as either one of a bit line driver and a bit line sinker and the second operation circuit acts as the other of the either one of the bit line driver and the bit line sinker so that the wiring line may provide a write-in bit line.

2. The magnetic random access memory according to claim 1, wherein through the wiring line which is connected to the other end of the memory cell, two currents having different directions are flown in accordance with data to be written in, during the write-in operation.

3. The magnetic random access memory according to claim 1, wherein in a semiconductor circuit in which the magnetic random access memory is formed, the first selection circuit is arranged below the memory cell.

4. The magnetic random access memory according to claim 1, wherein the magneto-resistive element comprises a Magnetic Tunnel Junction (MTJ) element.

5. A magnetic random access memory comprising:
   a plurality of memory cells each including a magneto-resistive element of which electrical resistance is altered by magnetism;
   a first sub-bit line which is connected to one end of a first memory cell of the plurality of memory cells;
   a first main-bit line which is connected to the first sub-bit line via a first selection circuit;
   a sense-amplifier which is connected to the first main-bit line via a second selection circuit;
   a second sub-bit line which is connected to one end of a second memory cell of the plurality of memory cells;
   a second main-bit line which is connected to the second sub-bit line via a third selection circuit;
   a fourth selection circuit which is connected between the second main-bit line and the sense-amplifier;
   a wiring line which is connected to the other ends of the first and second memory cells and arranged in a first wiring direction;
   a first operation circuit which is connected to one end of the wiring line via a fifth selection circuit;
   a second operation circuit which is connected to the other end of the wiring line;
   a first word line which passes through an intersection between the first memory cell and the wiring line and is arranged in a second wiring direction which is perpendicular to the first wiring direction; and
   a second word line which passes through an intersection between the second memory cell and the wiring line and is arranged in the second wiring direction which is perpendicular to the first wiring direction, wherein:
   during a read-out operation of reading out data from the first and second memory cells, the first operation circuit acts as a word line driver so that the wiring line may provide a read-out word line; and
   during a write-in operation of writing data into the first and second memory cells, the first operation circuit acts as either one of a bit line driver and a bit line sinker and the second operation circuit acts as the other of the either one of the bit line driver and the bit line sinker so that the wiring line may provide a write-in bit line.

6. The magnetic random access memory according to claim 5, wherein data items which are complementary to each other are written into the first and second memory cells in two write-in cycles.

7. The magnetic random access memory according to claim 6, wherein:
   in a first write-in cycle of the two write-in cycles, a current is flown through the first word line in a first current direction and a current is flown through the wiring line in a second current direction, to write data into the first memory cell; and in a second write-in cycle of the two write-in cycles, a current is flown through the second word line in the first current direction and a current is flown through the wiring line in a direction which is opposite the second current direction, to write data into the second memory cell.

8. The magnetic random access memory according to claim 5, wherein the first and third selection circuits each comprises an MOS transistor and gates of the MOS transistors are supplied with a common signal.

9. The magnetic random access memory according to claim 5, wherein the magneto-resistive element comprises a Magnetic Tunnel Junction (MTJ) element.

10. A magnetic random access memory comprising:
a plurality of memory cells each including a magneto-resistive element of which electrical resistance is altered by magnetism;
a first sub-bit line which is connected to one end of a first memory cell of the plurality of memory cells;
a first main-bit line which is connected to the first sub-bit line via a first selection circuit;
a sense-amplifier which is connected to the first main-bit line via a second selection circuit;
a second sub-bit line which is connected to one end of a second memory cell of the plurality of memory cells;
a second main-bit line which is connected to the second sub-bit line via a third selection circuit;
a fourth selection circuit which is connected between the second main-bit line and the sense-amplifier;
a first wiring line which is connected to the other end of the first memory cell and arranged in a first wiring direction;
a first operation circuit which is connected to one end of the first wiring line via a fifth selection circuit;
a second operation circuit which is connected to the other end of the first wiring line;
a second wiring line which is connected to the other end of the second memory cell and arranged in the first wiring direction;
a third operation circuit which is connected to one end of the second wiring line via a sixth selection circuit;
a fourth operation circuit which is connected to the other end of the second wiring line; and
a word line which passes through an intersection between the first memory cell and the first wiring line and an intersection between the second memory cell and the second wiring line and is arranged in a second wiring direction which is perpendicular to the first wiring direction; wherein:
during a read-out operation of reading out data from the first and second memory cells, the first and third operation circuits act as a word line driver so that the first and second wiring lines may provide a read-out word line;
during a write-in operation of writing data into the first memory cell, the first operation circuit acts as either one of a bit line driver and a bit line sinker and the second operation circuit acts as the other of the either one of the bit line driver and the bit line sinker so that the first wiring line may provide a write-in bit line; and
during a write-in operation of writing data into the second memory cell, when the first operation circuit is operating as a bit line driver, the third operation circuit acts as a bit line sinker and the fourth operation circuit acts as a bit line driver, while when the first operation circuit is operating as a bit line sinker, the third operation circuit acts as a bit line driver and the fourth operation circuit acts as a bit line sinker so that the second wiring line may provide a write-in bit line.

11. The magnetic random access memory according to claim 10, wherein a current flows through the second wiring line in a direction which is opposite a direction in which a current flows through the first wiring line.

12. The magnetic random access memory according to claim 10, wherein the first and second memory cells which share the word line in use and are connected to the first and second sub-bit lines respectively are selected at the same time, to undergo the write-in or read-out operation.

13. The magnetic random access memory according to claim 10, wherein the first and third selection circuits each comprises an MOS transistor and gates of the MOS transistors are supplied with a common signal.

14. The magnetic random access memory according to claim 10, wherein data items which are complementary to each other are written into the first and second memory cells in one write-in cycle.

15. The magnetic random access memory according to claim 14, wherein in the first write-in cycle, a current is flown through the first wiring line in a first current direction and a current is flown through the second wiring line in a second current direction opposite to the first current direction and also a current is flown through the word line, to thereby write data into the first and second memory cells.

16. The magnetic random access memory according to claim 14, wherein in a semiconductor circuit in which the magnetic random access memory is formed, the plurality of memory cells are connected to the sub-bit line and a region in which the plurality of memory cells are formed is different from a region in which the selection circuit which is connected between the sub-bit line and the main-bit line is arranged.

17. The magnetic random access memory according to claim 16, wherein in a semiconductor circuit in which the magnetic random access memory is formed, a pitch at which the main bit lines are arranged is the same as a pitch at which the plurality of memory cells connected to the sub-bit line are arranged; and a pitch at which the selection circuits provided between the sub-bit line and the main-bit line are arranged is twice the same pitch.

18. The magnetic random access memory according to claim 10, wherein the magneto-resistive element comprises a Magnetic Tunnel Junction (MTJ) element.

* * * * *